United States Patent [19]

Smith

[11] Patent Number: 5,548,207

[45] Date of Patent: Aug. 20, 1996

[54] MISSING PHASE DETECTOR

[75] Inventor: Gerald L. Smith, Torrance, Calif.

[73] Assignee: Magl Power Inc., Torrance, Calif.

[21] Appl. No.: 437,295

[22] Filed: May 8, 1995

[51] Int. Cl.$^6$ ................................................ G01R 1/04
[52] U.S. Cl. ........................ 324/86; 324/107; 361/76
[58] Field of Search .......................... 324/77, 76.72, 324/86, 87, 107, 772, 108; 361/76, 77, 82, 84, 85, 97, 79; 340/600, 651, 658

[56] References Cited

U.S. PATENT DOCUMENTS

| | | | |
|---|---|---|---|
| 4,544,982 | 10/1985 | Boothman et al. | 361/76 |
| 4,600,962 | 7/1986 | Bliehall | 361/77 |
| 4,710,703 | 12/1987 | Harkiewicz et al. | 324/86 |
| 4,724,503 | 2/1988 | Libert | 361/77 |
| 4,751,653 | 6/1988 | Junk et al. | 361/76 |
| 4,901,005 | 2/1990 | Shin et al. | 324/86 |
| 5,003,242 | 3/1991 | Ziber | 318/778 |
| 5,298,853 | 3/1994 | Ryba | 324/86 |
| 5,337,206 | 8/1994 | Kadah et al. | 361/78 |
| 5,378,979 | 1/1995 | Lombardi | 324/86 |

Primary Examiner—Sandra L. O'Shea
Assistant Examiner—Raymond Y. Mah
Attorney, Agent, or Firm—Monty Koslover Assoc.

[57] ABSTRACT

A missing phase detector circuit which monitors the ac three-phase output voltages of power equipment or sources and produces an output signal in the event a missing ac phase is detected. The circuit reduces the monitored phase voltages to low values and produces an ac ripple voltage waveform where each ripple represents a phase. An analyzer circuit examines the ac ripple voltage waveform for its zero crossings and produces a pulsed dc waveform where the width of the pulses is normally small. If any of the pulses is found to be wide, indicating a missing phase, a positive high signal is output by an AND gate. This output signal may be used to initiate illumination of a "Missing Phase" indicator or it may be used for equipment control purposes. Provision is made to prevent a false output signal when there is no input power. The circuit is not sensitive to frequency, power factor or unbalanced loads. Brown-outs (low ac voltages) do not affect the analyzer portion which looks only at ac ripple zero crossing points and not at amplitudes. The circuit components are low power, low in stress and few in number. Thus the circuit has high reliability.

1 Claim, 2 Drawing Sheets

MISSING PHASE DETECTOR

BACKGROUND AND SUMMARY OF THE INVENTION

This invention relates to devices for monitoring the electrical output of 3—phase ac generators, and more particularly to devices for detection of a missing ac phase. A generator output having a missing phase—that is to say only two of three phases are evident—can produce severe losses, poor operation and possibly damage to electrical loads. The need for monitoring 3—phase ac generators has therefore long been noted and missing phase detector devices have been employed. These missing phase detectors are well known in industry and are used in many applications for monitoring and protection of 3—phase loads and circuits.

Currently available missing phase detectors utilize solid-state components and integrated circuits to assist in speed and accuracy of detection. However, the available missing phase detectors still have a number of shortcomings which should be corrected. These are:

(a) The detectors tend to malfunction with motor loads when a missing phase occurs, due to a motor missing phase " fill-in" phenomenon;

(b) The detectors are adversely affected by severely un-balanced loads, producing a false 'missing phase'

(c) The detectors are sensitive to brown-outs, often resulting in detector malfunction; and (d) The detectors are sensitive to frequency and voltage changes, and also to line distortion, producing errors.

Thus there exists a need for an improved missing phase detector that does not have the above listed problem areas.

The present invention device is presented in response to the foregoing need for an improved missing phase detector. The device comprises an isolation transformer, a three-phase rectifier and an analyzer circuit. The three-phase output of the equipment being monitored is connected to the primary windings of the isolation transformer which steps down the input voltages to low amplitudes induced in the secondary windings. The transformer secondary voltages are applied to a rectifier which produces a three phase rectified signal with respect to logic ground, and having a ripple wave shape. The ripple waveform is centered on a reference voltage and is passed to an analyzer circuit which examines the ripple wave signal, determines whether a missing phase is present and outputs a "missing phase" signal if one is detected. It does this by looking only at the ripple signal at its zero crossing points, without regard to peak levels.

Since the detector is not referenced to any fixed frequency or absolute voltage levels the detector is not sensitive to frequency or voltage changes or brownouts. Line distortion effects are not passed through and do not interfere with the analyzer. Similarly, unbalanced loads which affect voltage levels do not affect the analyzer portion of the detector.

An advantage of the invention is that unlike state of the art missing phase detectors, the invention detector will function accurately with power factor loads such as motors.

Another advantage of the invention is that it is highly reliable because of its small component count. An advantage accruing from the use of few components is the relatively low cost of the detector device.

Accordingly, it is a principal object of this invention to provide an improved missing phase detector device that is not sensitive to the monitored frequency or voltage levels or changes thereof.

Another object is to provide an improved missing phase detector device that is not adversely affected by monitored source line distortion, power brown-outs or sub-cyclic drop-outs.

Further objects and advantages of the invention will be apparent from studying the following portion of the specification, the claims and the attached drawings.

DESCRIPTION OF THE PREFERRED EMBODIMENT

Figure 1:
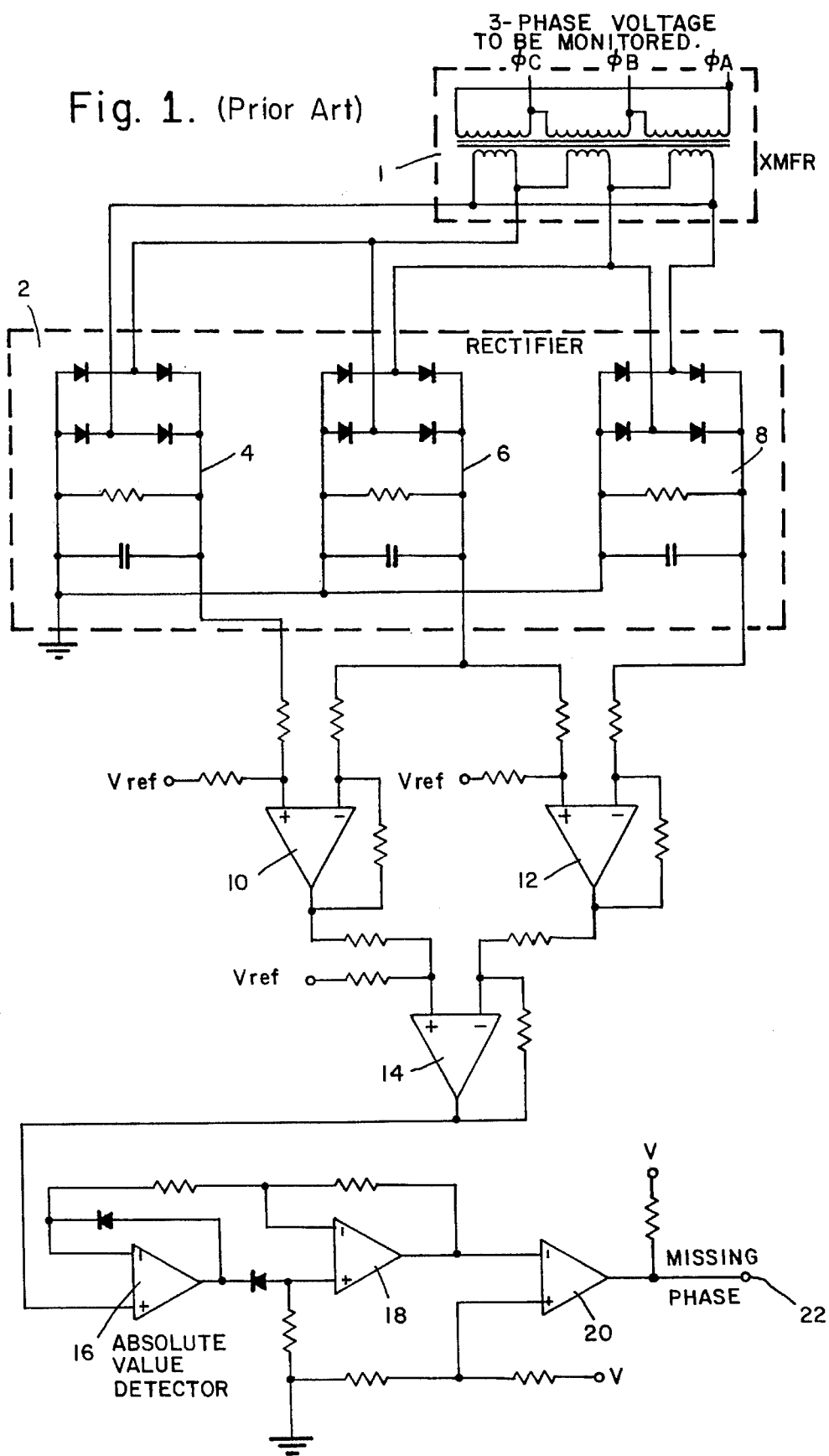
FIG. 1 is a simplified schematic diagram of a prior art missing- phase detector.

Referring particularly to the drawings, there is shown in FIG. 1 a simplified schematic of a prior art missing-phase detector device which is typical of state of the art detectors. This detector functions in the following manner: The three-phase voltages to be monitored, phases A, B and C are input to the primary windings of an isolation transformer 1 which steps down the input voltages. The transformer 1 secondary windings and three output voltage waveforms are connected to a rectifier 2 consisting of three full wave bridge rectifier circuits 4,6,8, which each produce a dc ripple voltage signal corresponding to each phase.

The rest of the device is an analyzer circuit whose function it is to look at the three phase dc ripple signals from the rectifier 2 circuits and to discriminate between a dc signal indicating a missing phase and a normal (no missing phase dc signal.

The three phase dc ripple voltage signals are input to a set of three difference amplifiers 10, 12, 14, with the output signals of the first 10 and second 12 difference amplifiers connected input to the third 14 difference amplifier. The output signal of the third 14 difference amplifier is connected input to a two stage absolute-value detector circuit 16, 18 which gives a negative output signal equal to the magnitude of the input signal. This negative output signal is fed to a comparator 20 which compares it with a reference and may output 22 a "missing phase" signal if such is found.

The prior art missing-phase detector device is seen to suffer from its apparent ability to pass line distortion through from the monitored source to its analyzer logic portion, tending to occasionally produce inaccurate logic operation and results, depending on the degree of distortion. Similarly, changes in line voltages and frequency are passed through with varying resulting effects. These effects include complete malfunction as may occur when a low voltage input due to brown out is combined with a missing phase.

It is with the intent of overcoming and eliminating the state of the art detector operation problems, that the present invention detector device was designed.

Figure 2:
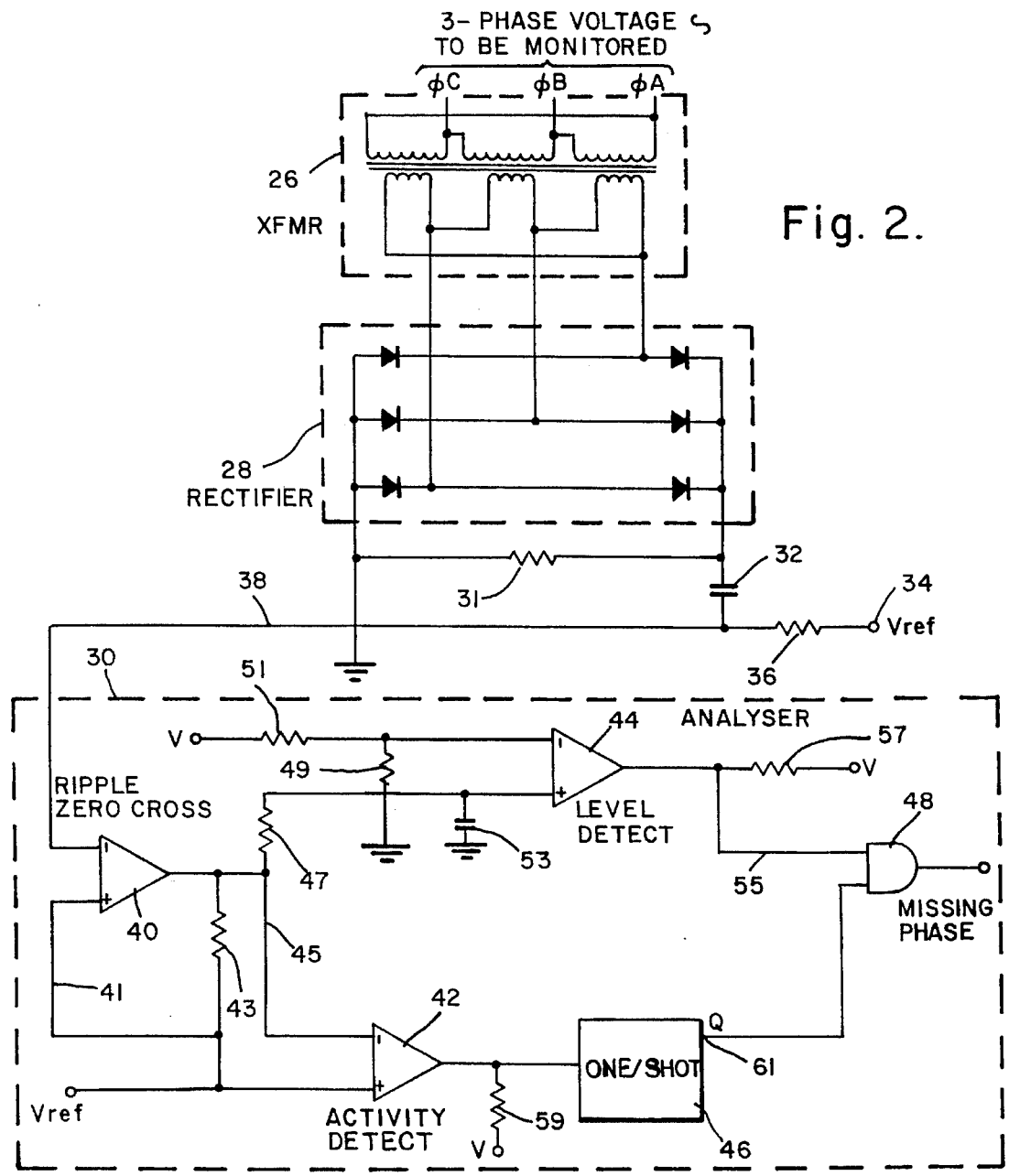
FIG. 2 is a simplified schematic diagram of a missing-phase detector circuit according to the present invention.

Refer to FIG. 2 which is a simplified circuit schematic of the present invention. The device comprises an isolation transformer 26, a three-phase rectifier 28, a voltage center reference circuit and an analyzer circuit 30. Operation of the device is as follows: The three-phase voltage waveforms, phases A, B, C being monitored, are connected to the primary windings of a step-down isolation transformer 26. A stepped down voltage is induced into the secondary windings of the transformer 26 and the resulting three-phase waveforms are connected to a six-pole rectifier 28. The output of the rectifier 28 is connected to a termination resistor 31, producing a rectified signal waveform with respect to logic ground. This rectified signal, which has a ripple wave shape, is AC coupled to a voltage center reference circuit through a coupling capacitor 32, a resistor 35 and to a voltage reference (Vref) 34 terminating the resistor. The rectified signal waveform thus becomes centered at its ripple voltage average on the voltage reference (Vref) 34.

Figure 3:
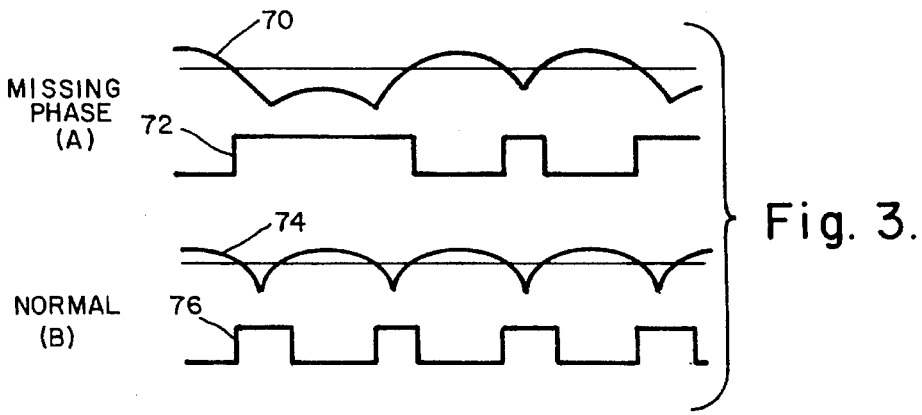
FIG. 3 illustrates the waveforms at the input to and inside the analyzer portion of the circuit, and useful in understanding the function and operation of the analyzer portion.

To see what this signal waveform will look like, please refer to FIG. 3. FIG. 3 illustrates a typical missing phase rectified signal waveform (A) 70 and a normal three phase rectified signal waveform (B) 74. Beneath each of the rectified signal waveforms 70, 74 is illustrated the equivalent waveform 72, 76 generated by the analyzer circuit.

It should be noted that the ripple voltage waveform is centered on an arbitrary reference voltage (Vref) which is not related to the input three phase voltages. An input voltage brown out will therefore make no difference to the dc value of the waveform signal at this point.

The ripple voltage waveform is connected to the analyzer circuit 30 and input to a zero cross comparator 40 which will switch at every zero crossing of the waveform. The second input to the comparator 40 is connected 41 to reference voltage Vref.

The output of the comparator 40 is terminated with a third resistor 43 which is connected to Vref. Thus, the switched waveform at the output of the zero crossing comparator 40 will now be referenced to Vref and will appear as pulsed square waves similar to the waveforms 72, 76 shown in FIG. 3.

The pulsed square waves at the zero crossing comparator 40 output are connected to a low pass filter consisting of a fourth resistor 47 and a second capacitor 53, which integrates the wave form into an average dc level and connects this signal to the input of a level detector comparator 44. Since the absence of a voltage phase shows, up as a wide negative portion of ripple that causes some positive pulses of the square wave to be wider than the others, the average dc level produced by the low pass filter, in this case, will increase above that for a normal three-phase input.

Fifth and sixth resistors 49, 51 connected to logic ref. voltage and ground, set the detect level which is input to the level detect comparator 44. At a high input signal, the comparator 44 will trip high, raised by a pull-up resistor 57 and voltage, and the output high is connected 55 to an input of an AND gate 48.

The ripple zero cross comparator 40 output is also connected 45 to an input of an activity detector comparator 42. The comparator 42 output will go high, raised by a pull-up resistor 59 and voltage, when there is any pulsed input to it resulting from an ac input voltage to the isolation transformer 26. The output signal of the activity detector comparator 42 is applied to a retriggerable one-shot 46, and with any input voltage activity indicated by a high signal, the one-shot output Q terminal 61 will go high and be applied to the second input of the AND gate 48. The AND gate 48 will now be enabled to allow a high "missing phase" signal from the level detector 44 to pass. This "missing phase" signal can be used to trigger the illumination of an indicator or for control purposes.

It should be noted that the purpose of the activity detector 42 and the one-shot 46 is to disable a "missing phase" output during periods of power off with no input voltage.

A careful review of the device circuit characteristics shows that although some input line distortions may be passed through to the analyzer portion, they will have no effect on its output. This is because the distortions ride on the ripple wave and the zero cross comparator 40 looks only at the zero crossings of the ripple wave, without regard to the wave shape or amplitude. The distortions do not pass through the zero cross comparator. Similarly, changes in voltage or frequency do not affect the analyzer.

Finally, it is clear that the analyzer portion of the device is a low voltage, low power consumption circuit which can be accommodated on a printed circuit board having few integrated circuit components and low power resistors and capacitors. The isolation transformer and the three-phase rectifier may also be relatively small since they pass and consume very little power as do the remaining components.

All electrical components are selected and rated to produce low voltage and current stress. This combined with low heat dissipation requirements and a small quantity of critical components in the device results in a projected high reliability for the invention device.

The relative simplicity of the device compared with state of the art missing phase detectors, ensures that the present invention device will cost less to produce than these available detectors.

To sum up the advantages of the invention as compared with the presently used state of the art missing phase detectors, the following applies.

The invention missing phase detector:

a) is not sensitive to input frequency;

b) will function with power factor loads;

c) is not sensitive to voltage levels or brown-outs;

d) is not sensitive to unbalanced loads on the monitored source;

e) rejects input line distortion;

f) is highly reliable; and g) relatively low cost.

These characteristics and advantages make the invention missing-phase detector a significant improvement on the state of the art missing-phase detectors.

From the above description it is clear that the preferred embodiment achieves the objects of the present invention. Alternative embodiments and various modifications may be apparent to those skilled in the art. These alternatives and modifications are considered to be within the spirit and scope of the present invention.

Having described the invention, what is claimed is:

1. A missing phase detector circuit for three-phase ac power equipment, comprising in combination:

(a) a three-phase isolation transformer adapted to step down monitored three phase ac power source voltages to low voltage levels;

(b) a three-phase rectifier circuit, said rectifier circuit being connected to the secondary windings of said isolation transformer;

(c) a first resistor, said first resistor being connected across the output of said rectifier circuit and connected to logic ground, said first resistor acting as a termination for the signal output of said rectifier circuit, producing a three-phase rectified signal with respect to logic ground, said three-phase rectified signal having a ripple voltage waveform;

(d) a voltage center reference circuit comprising a first capacitor, a second resistor and a voltage reference terminating said second resistor; said first capacitor being connected to the positive terminal of said first resistor and said rectifier circuit, and providing AC coupling for said ripple voltage waveform to said second resistor, producing at a capacitor-resistor junction, a ripple voltage ac waveform which is centered, positive and negative, on said voltage reference; and (e) an analyzer circuit connected to said capacitor-resistor junction, comprising a zero cross comparator circuit, a low pass filter, a level detector comparator circuit, an activity detector comparator circuit, a retriggerable one-shot and an AND gate;

said zero cross comparator circuit including a dc voltage reference and receiving said ripple voltage ac waveform, said zero cross comparator circuit switching at every zero crossing and producing a pulsed dc waveform having an amplitude corresponding to said dc voltage reference and pulse widths corresponding to the widths of the negative portions of said ripple voltage ac waveform, a wide pulse width being produced by a wide negative portion of ripple voltage and thereby a missing ac voltage phase;

said pulsed dc waveform being connected input to said low pass filter which integrates said pulsed dc waveform into an average dc level signal, said dc level signal being high if said pulsed dc waveform has any wide pulse widths;

said dc level signal being connected input to said level detector comparator circuit which outputs a high signal if said dc level signal exceeds a reference, said high signal being connected to an input terminal of said AND gate;

said pulsed dc waveform output of said zero cross comparator circuit also being connected to an input terminal of said activity detector comparator circuit; said activity detector circuit receiving said pulsed dc waveform and producing a high signal output which is connected input to said one-shot; said one-shot responding by producing a high signal at its Q terminal, said Q terminal being connected to an input terminal of said AND gate and said AND gate being enabled by the presence of said high signal from said Q terminal; said activity detector comparator circuit and said one-shot serving to disable said AND gate during periods of no power input;

said AND gate being activated by the receipt of a high signal from said level detector comparator circuit, and passing an output signal which may be used to illuminate a "Missing Phase" indicator or as input to control circuitry.

* * * * *